(12) United States Patent
Kim et al.

(10) Patent No.: US 11,901,031 B2
(45) Date of Patent: Feb. 13, 2024

(54) MEMORY DEVICE PERFORMING REPAIR OPERATION

(71) Applicant: SK hynix Inc., Icheon-si (KR)

(72) Inventors: Yong Sun Kim, Icheon-si (KR); Mi Hyun Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/673,286

(22) Filed: Feb. 16, 2022

(65) Prior Publication Data

US 2023/0178171 A1    Jun. 8, 2023

(30) Foreign Application Priority Data

Nov. 24, 2021   (KR) ..................... 10-2021-0163830

(51) Int. Cl.
*G11C 29/12*    (2006.01)
*G11C 29/54*    (2006.01)

(52) U.S. Cl.
CPC .................................. *G11C 29/54* (2013.01)

(58) Field of Classification Search
CPC ............ G11C 29/54; G11C 2029/1204; G11C 29/785; G11C 29/4401; G11C 2029/4402; G11C 29/808; G11C 29/76; G11C 29/787
See application file for complete search history.

(56) References Cited

U.S. PATENT DOCUMENTS

| | | | |
|---|---|---|---|
| 2006/0242492 A1 | 10/2006 | Hoffmann et al. | |
| 2017/0110206 A1* | 4/2017 | Ryu | ............... G11C 29/4401 |
| 2018/0102183 A1* | 4/2018 | Shim | .................. G11C 29/44 |
| 2020/0327003 A1* | 10/2020 | Kang | ................ G06F 11/1044 |

FOREIGN PATENT DOCUMENTS

KR    1020170088600 A    8/2017

* cited by examiner

*Primary Examiner* — Mohammed A Bashar
(74) *Attorney, Agent, or Firm* — William Park & Associates Ltd.

(57) ABSTRACT

A memory device includes a fail test circuit configured to generate a fail flag indicating whether a failure was detected in a column line, on the basis of internal data outputted from the column line selected according to a column address, when performing a test, and control the fail flag to indicate that the failure was detected in the column line, on the basis of a fail control signal. The memory device also includes a repair information generation circuit configured to generate, from the column address, a repair column address for repairing the column line, on the basis of the fail flag.

17 Claims, 13 Drawing Sheets

MEMORY DEVICE PERFORMING REPAIR OPERATION

CROSS-REFERENCES TO RELATED APPLICATIONS

The present application claims priority under 35 U.S.C. § 119(a) to Korean application number 10-2021-0163830, filed in the Korean Intellectual Property Office on Nov. 24, 2021, the entire disclosure of which is incorporated herein by reference.

BACKGROUND

The present disclosure relates to a memory device which performs a repair operation.

A memory device performs a repair operation of replacing a failed memory cell with a normal memory cell. The repair operation includes a row repair operation of replacing a word line, coupled to a memory cell in which a failure occurred, with a normal word line and a column repair operation of replacing a column line, coupled to a memory cell in which a failure occurred, with a normal column line.

SUMMARY

Various embodiments of the present disclosure are directed to a memory device which performs a repair operation.

In an embodiment, a memory device may include: a fail test circuit configured to generate a fail flag indicating whether a failure was detected in a column line, on the basis of internal data outputted from the column line selected according to a column address, when performing a test, and control the fail flag to indicate that the failure was detected in the column line, on the basis of a fail control signal; and a repair information generation circuit configured to generate, from the column address, a repair column address for repairing the column line, on the basis of the fail flag.

In another embodiment, a memory device may include: a bank fail test circuit configured to generate a first fail bank flag indicating whether a failure was detected in a first memory bank, on the basis of first internal data outputted from a column line of the first memory bank, and control the first fail bank flag to indicate that a failure was detected in the first memory bank, on the basis of a first fail control signal, when performing a test; and an active row region information output circuit configured to output first bank active row region information as active row region information for repairing the column line, on the basis of the first fail bank flag, the first bank active row region information being generated when an active operation is performed in the first memory bank.

In another embodiment, a memory device may include: a repair information latch circuit configured to generate a repair column address for repairing a column line, from a column address corresponding to the column line, on the basis of a fail flag, and generate a latch block address from an internal block address indicating the position of a memory block, on the basis of the fail flag; and a block address selection circuit configured to generate a repair block address for repairing the column line, by selecting one of the latch block address and an external block address indicating the position of the memory block, on the basis of a mode register command.

In accordance with some embodiments, when performing a test for repairing a column line detected as a failure, the memory device may adjust the result of the test to repair a column line in which a failure is likely to occur, thereby repairing the column line in which a failure is likely to occur, through a repair circuit which repairs a column line in which a failure was detected.

Furthermore, the memory device may adjust the result of the test for each memory bank, such that information on a row region, generated for each memory bank, is selectively transferred to the repair circuit during an active operation, thereby repairing a column line in which a failure is likely to occur, for each row region.

In addition, the memory device may receive information on a memory block to which a column line in which a failure is likely to occur belongs, and input the received information to the repair circuit, on the basis of a command. Thus, the memory device may select and repair the memory block to which the column line in which a failure is likely to occur belongs.

DETAILED DESCRIPTION

In the descriptions of the following examples, the term "preset" indicates that the value of a parameter is decided prior to being used in a process or algorithm. According to an example, the value of the parameter may be set when the process or algorithm is started or while the process or algorithm is being performed.

Terms such as "first" and "second," which are used to distinguish among various components, are not limited by the components. For example, a first component may be referred to as a second component, and vice versa.

When one component is referred to as being "coupled" or "connected" to another component, it may indicate that the components may be directly coupled or connected to each other or coupled or connected to each other through another component interposed therebetween. On the other hand, when one component is referred to as being "directly coupled" or "directly connected" to another component, it may indicate that the components are directly coupled or connected to each other without another component interposed therebetween.

"Logic high level" and "logic low level" are used to describe the logic levels of signals. A signal having a "logic high level" is distinguished from a signal having a "logic low level." For example, when a signal having a first voltage corresponds to a "logic high level," a signal having a second voltage may correspond to a "logic low level." According to an example, a "logic high level" may be set to a voltage higher than a "logic low level." According to an example, the logic levels of signals may be set to different logic levels or opposite logic levels. For example, a signal having a logic high level may be set to have a logic low level according to an example, and a signal having a logic low level may be set to have a logic high level according to an example.

Hereafter, the teachings of the present disclosure will be described in more detail with reference to embodiments. The embodiments are only used to exemplify the teachings of the present disclosure, and the scope of the present disclosure is not limited by the examples.

Figure 1:
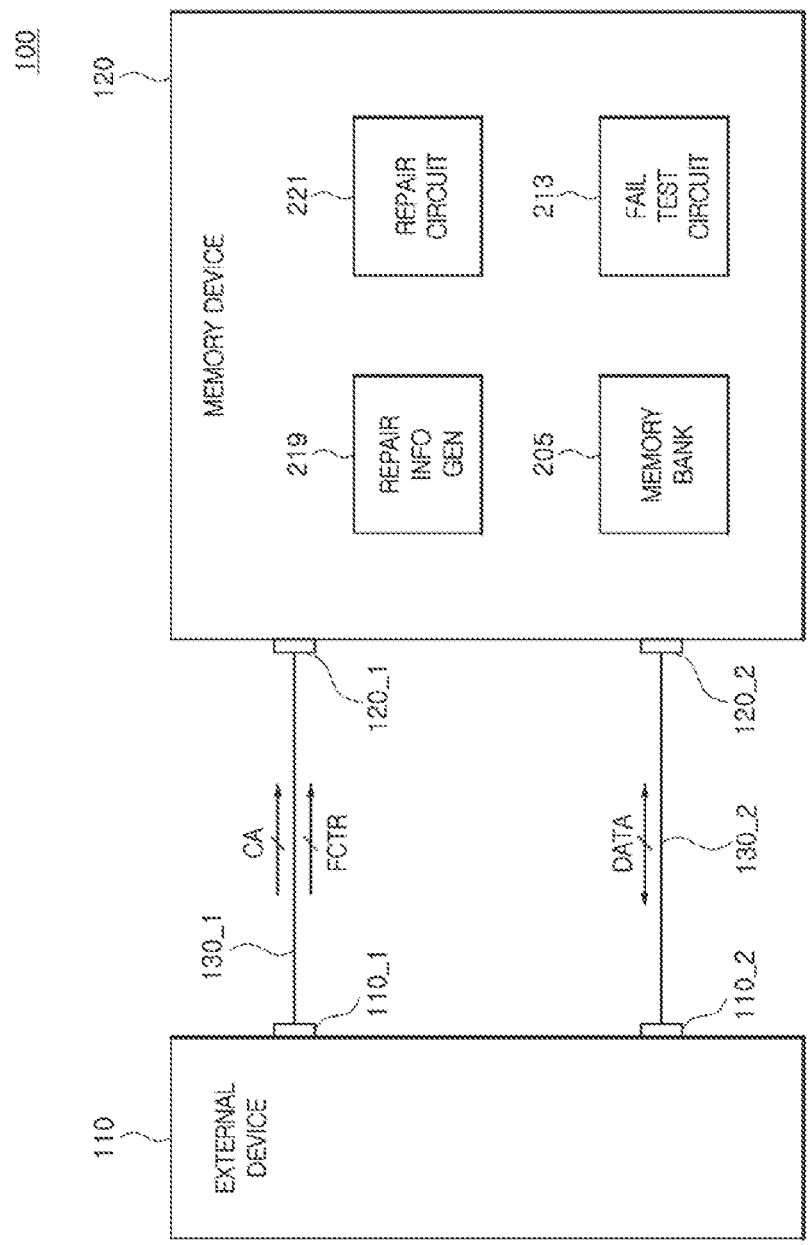
FIG. 1 is a block diagram illustrating an example configuration of an electronic system in accordance with an embodiment.

FIG. 1 is a block diagram illustrating a configuration of an electronic system 100 in accordance with an embodiment. As illustrated in FIG. 1, the electronic system 100 may include an external device 110 and a memory device 120. In an embodiment, the external device 110 may be implemented as a memory controller or a test device.

The external device 110 may include a first device pin 110_1 and a second device pin 110_2. The memory device 120 may include a third device pin 120_1 and a fourth device pin 120_2. The external device 110 may transmit a command address CA to the memory device 120 through a first transmission line 130_1 coupled between the first device pin 110_1 and the third device pin 120_1. The external device 110 may transmit a fail control signal FCTR to the memory device 120 through the first transmission line 130_1 through which the command address CA is transmitted. The external device 110 may transmit/receive data DATA to/from the memory device 120 through a second transmission line 130_2 coupled between the second device pin 1102 and the fourth device pin 120_2.

The memory device 120 may include a memory bank 205, a fail test circuit 213, a repair information generation circuit (REPAIR INFO GEN) 219, and a repair circuit 221. The memory device 120 may receive the command address CA from the external device 110, and perform various internal operations such as an active operation, a read operation, a mode register write operation, and a test of detecting whether a failure occurred in a column line. The memory bank 205 may include a plurality of column lines corresponding to a column address (CADD of FIG. 2). The column address CADD may be applied through the command address CA from the external device 110.

The memory device 120 may receive the column address (CADD of FIG. 2) through the command address CA from the external device 110 in order to perform a test of detecting whether a failure occurred in a column line, the column address corresponding to a column line whose failure is to be detected. When performing a test of detecting whether a failure occurred in a column line, the memory device 120 may detect a column line in which a failure occurred, on the basis of data DATA outputted from the column line corresponding to the column address CADD, and repair the column line, detected as the failure, through the repair circuit 221. When the memory device 120 performs a test of detecting whether a failure occurred in a column line, the external device 110 may receive the data DATA outputted from the column line corresponding to the column address CADD, and check a column line in which no failure was detected, but a failure is likely to occur.

The memory device 120 may receive the column address (CADD of FIG. 2), corresponding to a column line in which a failure is likely to occur, through the command address CA from the external device 110. When performing a test of detecting whether a failure occurred in a column line, the memory device 120 may process a column line, in which a failure is likely to occur, as a column line in which a fail was detected, on the basis of the fail control signal FCTR. Thus, the memory device 120 may repair the column line in which a failure is likely to occur, through the repair circuit 221. The fail control signal FCTR may be applied from the external device 110, in order to repair the column line in which a failure is likely to occur.

Figure 2:
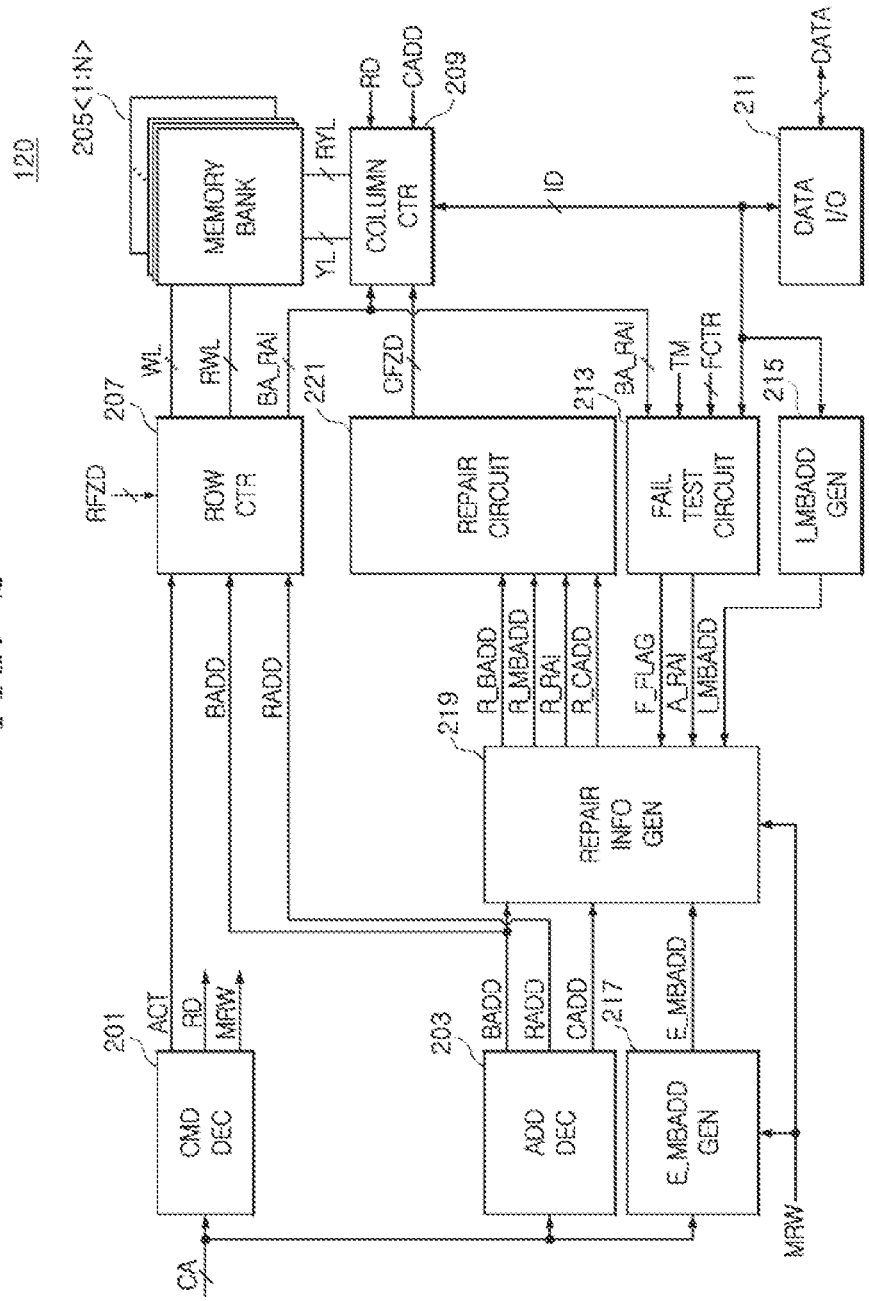
FIG. 2 is a block diagram illustrating an example configuration of a memory device illustrated in FIG. 1.

When a test of detecting whether a failure occurred in a column line is performed, the fail test circuit 213 may generate a fail flag (F_FLAG of FIG. 2) indicating whether a failure was detected in a column line, on the basis of internal data (ID of FIG. 2) outputted from a column line selected according to the column address (CADD of FIG. 2). When the test of detecting whether a failure occurred in a column line is performed, the fail test circuit 213 may control the fail flag F_FLAG to indicate that a failure was detected in the column line, on the basis of the fail control signal FCTR.

When the fail flag F_FLAG indicates that a failure was detected in the column line, the repair information generation circuit 219 may generate a repair column address (R_CADD of FIG. 2) from the column address (CADD of FIG. 2).

The repair circuit 221 may repair the column line in which a failure was detected, on the basis of the repair column address (R_CADD of FIG. 2).

Therefore, the memory device 120 may control the fail flag (F_FLAG of FIG. 2) to indicate that a failure was detected in a column line, on the basis of the fail control signal FCTR, thereby repairing a column line in which a failure is likely to occur, through the repair circuit 221 which repairs the column line in which a failure was detected.

FIG. 2 is a block diagram illustrating an example configuration of the memory device 120 illustrated in FIG. 1. As illustrated in FIG. 2, the memory device 120 may include a command decoder (CMD DEC) 201, an address decoder (ADD DEC) 203, the memory bank 205, a row control circuit (ROW CTR) 207, a column control circuit (COLUMN CTR) 209, a data input/output circuit (DATA I/O) 211, the fail test circuit 213, an internal block address generation circuit (I_MBADD GEN) 215, an external block address generation circuit (E_MBADD GEN) 217, the repair information generation circuit (REPAIR INFO GEN) 219, and the repair circuit 221.

The command decoder 201 may generate an active command ACT, a read command RD, and a mode register command MRW by decoding the command address CA. The command decoder 201 may activate the active command ACT by decoding the command address CA having a logic level combination for performing an active operation. The command decoder 201 may activate the read command RD by decoding the command address CA having a logic level combination for performing a read operation. The command decoder 201 may activate the mode register command MRW by decoding the command address CA having a logic level combination for performing a mode register write operation.

The address decoder 203 may generate a bank address BADD, a row address RADD, and a column address CADD by decoding the command address CA. The bank address BADD may be generated when an active operation or read operation is performed, and have a combination corresponding to the memory bank 205. The row address RADD may be generated when the active operation is performed, and have a combination corresponding to a normal word line WL. The column address CADD may be generated when the read operation is performed, and have a combination corresponding to a normal column line YL and a redundancy column line RYL.

The memory bank 205 may include first to $N^{th}$ memory banks 205<1:N>. Each of the first to $N^{th}$ memory banks 205<1:N> may include a plurality of cell arrays coupled between word lines and column lines. The plurality of cell arrays may store and output the internal data ID. The word lines may include normal word lines WL and redundancy word lines RWL, and the column lines may include normal column lines YL and redundancy column lines RYL. The normal word lines WL and the redundancy word lines RWL of the first to $N^{th}$ memory banks 205<1:N> may be sorted into row regions. For example, a first normal word line WL<1> and a first redundancy word line RWL<1> may be sorted into a first row region, and a second normal word line WL<2> and a second redundancy word line RWL<2> may be sorted into a second row region. The first to $N^{th}$ memory banks 205<1:N> may each include memory blocks. The memory blocks may include normal memory blocks including the normal column lines YL and redundancy memory blocks including the redundancy column lines RYL. The first to $N^{th}$ memory banks 205<1:N> may be implemented to have the same configuration. The configuration of the first memory bank 205<1> will be described below in detail with reference to FIG. 3.

When the active command ACT is activated, the row control circuit 207 may perform an active operation of activating a word line of the memory bank 205, selected according to the bank address BADD, on the basis of the row address RADD and row fuse data RFZD. The row fuse data RFZD may have a combination of the row address RADD, corresponding to a normal word line WL in which a failure occurred. The row fuse data RFZD may correspond to the respective redundancy word lines RWL. For example, first row fuse data RFZD<1> may correspond to a first redundancy word line RWL<1>, and second row fuse data RFZD<2> may correspond to a second redundancy word line RWL<2>. When performing the active operation, the row control circuit 207 may activate the word line by comparing the row address RADD to the row fuse data RFZD. More specifically, when the combination of the row address RADD is different from the combination of the row fuse data RFZD during the active operation, the row control circuit 207 may activate the normal word line WL corresponding to the combination of the row address RADD. When the combination of the row address RADD is equal to the combination of the row fuse data RFZD, the row control circuit 207 may activate the redundancy word line RWL corresponding to the row fuse data RFZD. The row fuse data RFZD may be generated by an ARE (Array Rupture E-fuse) circuit in which electrically programmable e-fuses are arranged.

When the active operation is performed in the memory bank 205 selected according to the bank address BADD, the row control circuit 207 may generate bank active row region information BA_RAI on the basis of the row address RADD and the row fuse data RFZD. The bank active row region information BA_RAI may include first to $N^{th}$ bank active row region information BA_RAI<1:N>, which indicate a row region to which an activated word line belongs, when the active operation is performed in the memory bank 205 selected according to the bank address BADD. For example, when the active operation is performed in the first memory bank 205<1>, the first bank active row region information BA_RAI<1> may indicate a row region to which an activated word line belongs. When the active operation is performed in the second memory bank 205<2>, the second bank active row region information BA_RAI<2> may indicate a row region to which an activated word line belongs. When the active operation is performed in the memory bank 205 selected according to the bank address BADD, the row control circuit 207 may generate the bank active row region information BA_RAI on the basis of a comparison result between the row address RADD and the row fuse data RFZD. For example, when the combination of the row address RADD is different from the combination of the row fuse data RFZD in the case that the active operation is performed in the first memory bank 205<1>, the row control circuit 207 may generate the first bank active row region information BA_RAI<1> indicating the row region to which an activated normal word line WL belongs. On the contrary, when the combination of the row address RADD is equal to the combination of the row fuse data RFZD in the case that the active operation is performed in the first memory bank 205<1>, the row control circuit 207 may generate the first bank active row region information BA_RAI<1> indicating the row region to which an activated redundancy word line RWL belongs. The operation in which the row control circuit 207 generates the bank active row region information BA_RAI will be described below in detail with reference to FIGS. 6 to 8.

When the read command RD is activated, the column control circuit 209 may perform a read operation of selecting a column line of the memory blocks included in the memory bank 205 and outputting the internal data ID, on the basis of the column address CADD, the bank active row region information BA_RAI, and column fuse data CFZD. The column fuse data CFZD may include information on the position of a column line in which a failure was detected. When performing the read operation, the column control circuit 209 may select the column line by comparing the column address CADD and the bank active row region information BA_RAI to information included in the column fuse data CFZD.

The data input/output circuit 211 may receive the data DATA and output the received data as the internal data ID, and receive the internal data ID and output the received data as the data DATA.

When performing a test on the basis of a test mode signal TM, the fail test circuit 213 may generate the fail flag F_FLAG on the basis of the internal data ID and the fail control signal FCTR. The test mode signal TM may be activated when a test of detecting whether a failure occurred in a column line is performed. The test mode signal TM may be generated on the basis of the command address CA. The fail flag F_FLAG may indicate whether a failure was detected in the column line selected according to the column address CADD. The fail flag F_FLAG may have a first logic level when a failure was detected in the column line selected according to the column address CADD. The fail flag F_FLAG may have a second logic level when no failure is detected in the column line selected according to the column address CADD. In the present embodiment, the first logic level and the second logic level may be set to a logic low level and a logic high level, respectively. The fail control signal FCTR may be activated to control the fail flag F_FLAG to indicate that a failure was detected in a column line. That is, the fail control signal FCTR may be activated to set the fail flag F_FLAG to have the first logic level.

When performing a test of detecting whether a failure occurred in a column line, the fail test circuit 213 may generate the fail flag F_FLAG by detecting whether the pattern of the internal data ID is a preset pattern. The pattern of the internal data may be defined as values of bits included in the internal data. The preset pattern may be set as one of the patterns of the internal data. The internal data ID may include first to $N^{th}$ internal data ID<1:N> outputted from the first to $N^{th}$ memory banks 205<1:N>, respectively. For example, the first internal data ID<1> may be outputted from a column line of the first memory bank 205<1>, and the second internal data ID<2> may be outputted from a column line of the second memory bank 205<2>. When the pattern of the internal data ID is different from the preset pattern in the case that the test is performed, the fail test circuit 213 may generate the fail flag F_FLAG indicating that a failure was detected in the column line. For example, when the pattern of the first internal data ID<1> outputted from the column line of the first memory bank 205<1> is different from the preset pattern, the fail test circuit 213 may generate the fail flag F_FLAG having the first logic level. When the pattern of the internal data ID is equal to the preset pattern in the case that the test is performed, the fail test circuit 213 may generate the fail flag F_FLAG indicating that no failure was detected in the column line. For example, when the pattern of the first internal data ID<1> outputted from the column line of the first memory bank 205<1> is equal to the preset pattern, the fail test circuit 213 may generate the fail flag F_FLAG having the second logic level. The preset pattern may be set to various patterns in different embodiments.

When performing a test, the fail test circuit 213 may control the fail flag F_FLAG to indicate that a failure was detected in a column line, on the basis of the fail control signal FCTR. The fail control signal FCTR may include first to $N^{th}$ fail control signals FCTR<1:N>. The first to $N^{th}$ fail control signals FCTR<1:N> may be activated to control the fail flag F_FLAG to indicate that failures were detected in column lines of the first to $N^{th}$ memory banks 205<1:N>, respectively. For example, the first fail control signal FCTR<1> may be activated to control the fail flag F_FLAG to indicate that a failure was detected in a column line of the first memory bank 205<1>. The second fail control signal FCTR<2> may be activated to control the fail flag F_FLAG to indicate that a failure was detected in a column line of the second memory bank 205<2>. When at least one of the first to $N^{th}$ fail control signals FCTR<1:N> is activated while the test is performed, the fail test circuit 213 may generate the fail flag F_FLAG having the first logic level. Thus, the fail test circuit 213 may control the repair circuit 221 to repair a column line in which a failure is likely to occur, on the basis of the fail control signal FCTR, the repair circuit 221 serving to repair a column line in which a failure was detected.

When performing a test on the basis of the test mode signal TM, the fail test circuit 213 may generate the active row region information A_RAI from the bank active row region information BA_RAI on the basis of the internal data ID and the fail control signal FCTR. The active row region information A_RAI may be generated to repair a column line, detected as a failure, for each row region.

When performing a test, the fail test circuit 213 may decide whether to output the bank active row region information BA_RAI as the active row region information A_RAI, on the basis of the internal data ID. More specifically, when performing the test, the fail test circuit 213 may detect the pattern of the first to $N^{th}$ internal data ID<1:N> outputted from the first to $N^{th}$ memory banks 205<1:N>, respectively, and output, as the active row region information A_RAI, the bank active row region information BA_RAI corresponding to the memory bank 205 to which a column line in which a failure was detected belongs, according to the detection result. For example, when the pattern of the first internal data ID<1> outputted from the first memory bank 205<1> is different from the preset pattern while the test is performed, the fail test circuit 213 may output first bank active row region information BA_RAI<1> corresponding to the first memory bank 205<1> as the active row region information A_RAI. For example, when the pattern of the second internal data ID<2> outputted from the column line of the second memory bank 205<2> is different from the preset pattern while the test is performed, the fail test circuit 213 may output the second bank active row region information BA_RAI<2> corresponding to the second memory bank 205<2> as the active row region information A_RAI.

When performing a test, the fail test circuit 213 may output the bank active row region information BA_RAI as the active row region information A_RAI, on the basis of the fail control signal FCTR. More specifically, when performing the test, the fail test circuit 213 may output, as the active row region information A_RAI, one of the first to $N^{th}$ bank active row region information BA_RAI<1:N> which correspond to the first to $N^{th}$ memory banks 205<1:N>, respectively. For example, when the first fail control signal FCTR<1> corresponding to the first memory bank 205<1> is activated while the test is performed, the fail test circuit 213 may output the first bank active row region information BA_RAI<1> as the active row region information A_RAI. For another example, when the second fail control signal FCTR<2> corresponding to the second memory bank 205<2> is activated while the test is performed, the fail test circuit 213 may output the second bank active row region information BA_RAI<2> as the active row region information A_RAI. Therefore, the fail test circuit 213 may selectively transfer the bank active row region information BA_RAI, generated for the respective memory banks 205, to the repair circuit 221 on the basis of the fail control signals FCTR corresponding to the respective memory banks 205. Thus, the repair circuit 221 may repair a column line in which a failure was detected, for each row region. The configuration and operation of the fail test circuit 213 will be described below in detail with reference to FIG. 4.

The internal block address generation circuit 215 may generate the internal block address I_MBADD on the basis of the internal data ID. The internal block address I_MBADD may indicate the position of a memory block to which a column line in which a failure occurred belongs. The bits of the internal data ID may be outputted from the respective memory blocks included in the memory bank 205. For example, first and second bits of the first internal data ID<1> outputted from the first memory bank 205<1> may be outputted from first and second memory blocks included in the first memory bank 205<1>, respectively. The internal block address generation circuit 215 may generate the internal block address I_MBADD by detecting whether the value of the bits included in the internal data ID is a preset bit value.

When a mode register write operation is performed on the basis of the mode register command MRW, the external block address generation circuit 217 may extract the external block address E_MBADD from the bits of the command address CA. The external block address E_MBADD may be applied from the external device (110 of FIG. 1) through the command address CA when the mode register write operation is performed, and indicate the position of a memory block to which a column line in which a failure is likely to occur belongs.

The repair information generation circuit 219 may generate a repair bank address R_BADD, a repair block address R_MBADD, repair row region information R_RAI, and the repair column address R_CADD, which are used to repair a column line in which a failure was detected, from the bank address BADD, the internal block address I_MBADD, the external block address E_MBADD, the active row region information A_RAI, and the column address CADD on the basis of the fail flag F_FLAG and the mode register command MRW. The repair bank address R_BADD may have a combination of the bank address BADD, corresponding to the memory bank 205 to which a column line in which a failure was detected belongs. The repair block address R_MBADD may indicate the position of a memory block to which a column line in which a failure was detected belongs. When the fail flag F_FLAG indicates that a failure was detected in a column line, the repair row region information R_RAI may indicate a row region to which a word line activated during the active operation belongs. The repair column address R_CADD may have a combination of the column address CADD, corresponding to a column line in which a failure was detected.

When the fail flag F_FALG indicates that a failure was detected in a column line, the repair information generation circuit 219 may latch the bank address BADD, and output the latched address as the repair bank address R_BADD. When the fail flag F_FALG indicates that a failure was detected in a column line, the repair information generation circuit 219 may latch the active row region information A_RAI, and output the latched information as the repair row region information R_RAI. When the fail flag F_FALG indicates that a failure was detected in a column line, the repair information generation circuit 219 may latch the column address CADD, and output the latched address as the repair column address R_CADD.

The repair information generation circuit 219 may generate the repair block address R_MBADD by selecting one of the internal block address I_MBADD and the external block address E_MBADD, on the basis of the fail flag F_FLAG and the mode register command MRW. When the fail flag F_FALG indicates that a failure was detected in a column line, the repair information generation circuit 219 may latch the internal block address I_MBADD. The repair information generation circuit 219 may select one of the latched internal block address I_MBADD and the external block address E_MBADD and output the selected address as the repair block address R_MBADD, on the basis of the mode register command MRW. More specifically, when the mode register command MRW is inactivated, the repair information generation circuit 219 may output the latched internal block address I_MBADD as the repair block address R_MBADD. When the mode register command MRW is activated, the repair information generation circuit 219 may output the external block address E_MBADD as the repair block address R_MBADD. Therefore, the repair information generation circuit 219 may input the external block address E_MBADD to the repair circuit 221 on the mode register command MRW, the external block address E_MBADD indicating the position of a memory block to which a column line in which a failure is likely to occur belongs. Thus, the memory block to which the column line in which a failure is likely to occur belongs may be selected and repaired. The configuration and operation of the repair information generation circuit 219 will be described below in detail with reference to FIG. 5.

The repair circuit 221 may program the column fuse data CFZD including information on the position of a column line in which a failure was detected, on the basis of the repair bank address R_BADD, the repair block address R_MBADD, the repair row region information R_RAI, and the repair column address R_CADD, thereby repairing the column line in which the failure was detected. The repair circuit 221 may include an ARE (Array Rupture E-fuse) circuit in which electrically programmable e-fuses are arranged.

Figure 3:
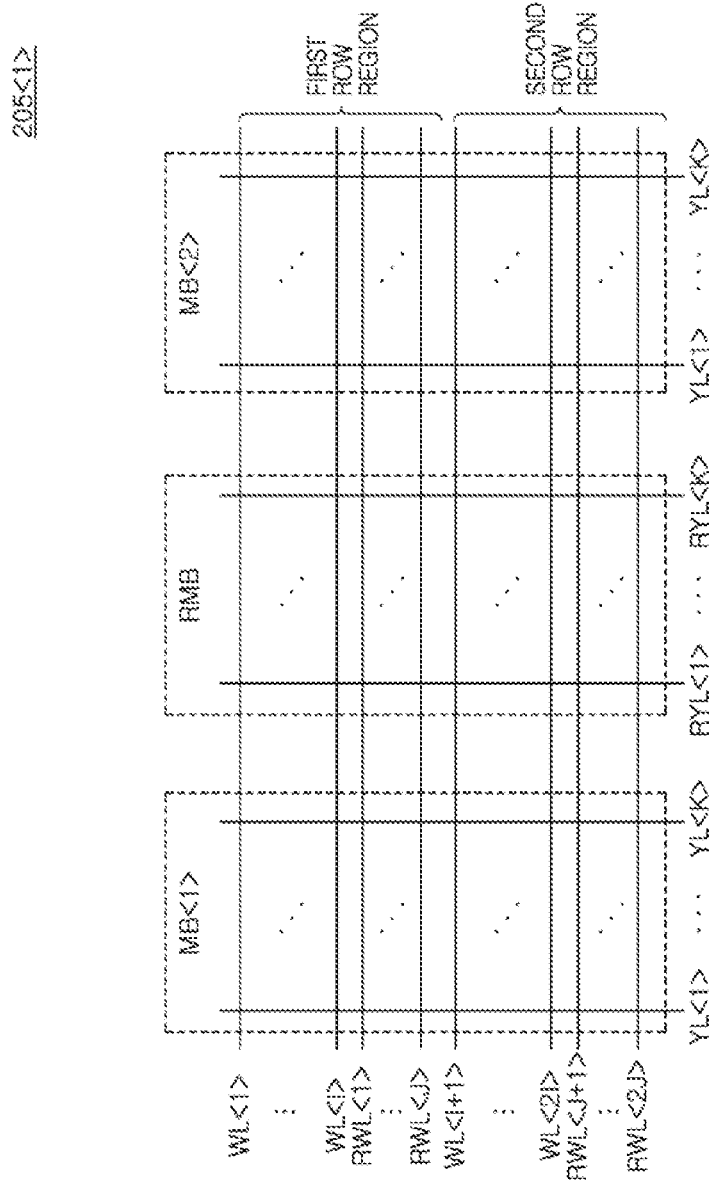
FIG. 3 is a diagram illustrating an example configuration of a memory bank illustrated in FIG. 2.

FIG. 3 is a diagram illustrating an example configuration of the memory bank 205<1> illustrated in FIG. 2. As illustrated in FIG. 3, the first memory bank 205<1> may include word lines WL and RWL arranged in a horizontal direction and column lines YL and RYL arranged in a vertical direction. A cell array (not illustrated) may be coupled to word lines WL<1:2I> and RWL<1:2J> and column lines YL<1:K> and RYL<1:K>, and store and output the internal data (ID of FIG. 2).

The word lines may include first to $2I^{th}$ normal word lines WL<1:2I> and first to $2J^{th}$ redundancy word lines RWL<1:2J>. The first to $2I^{th}$ normal word lines WL<1:2I> may correspond to combinations of the row address (RADD of FIG. 2), respectively. For example, the first normal word line WL<1> may correspond to a first combination of the row address RADD, and the second normal word line WL<2> may correspond to a second combination of the row address RADD. The first to $2J^{th}$ redundancy word lines RWL<1:2J> may correspond to the row fuse data (RFZD of FIG. 2), respectively. For example, the first redundancy word line RWL<1> may correspond to first row fuse data RFZD<1>, and the second redundancy word line RWL<2> may correspond to second row fuse data RFZD<2>.

The first to $I^{th}$ normal word lines WL<1:I> and the first to $J^{th}$ redundancy word lines RWL<1:J> may be sorted into a first row region FIRST ROW REGION. The $(I+1)^{th}$ to $2I^{th}$ normal word lines WL<I+2I> and the $(J+1)^{th}$ to $2J^{th}$ redundancy word lines RWL<J+1:2J> may be sorted into a second row region SECOND ROW REGION. When a word line belonging to the first row region FIRST ROW REGION is activated, the first bank active row region information (BA_RAI<1> of FIG. 2) corresponding to the first memory bank 205<1> may indicate the first row region FIRST ROW REGION. On the contrary, when a word line belonging to the second row region SECOND ROW REGION is activated, the first bank active row region information BA_RAI<1> corresponding to the first memory bank 205<1> may indicate the second row region SECOND ROW REGION.

The first memory bank 205<1> may include first and second normal memory blocks MB<1:2> including first to $K^{th}$ normal column lines YL<1:K> and redundancy memory blocks RMB including first to $K^{th}$ redundancy column lines RYL<1:K>. The first to $K^{th}$ normal column lines YL<1:K> and the first to $K^{th}$ redundancy column lines RYL<1:K> may correspond to combinations of the column address (CADD of FIG. 2), respectively. For example, the first normal column line YL<1> and the first redundancy column line RYL<1> may correspond to a first combination of the column address CADD, and the second normal column line YL<2> and the second redundancy column line RYL<2> may correspond to a second combination of the column address CADD.

Figure 4:
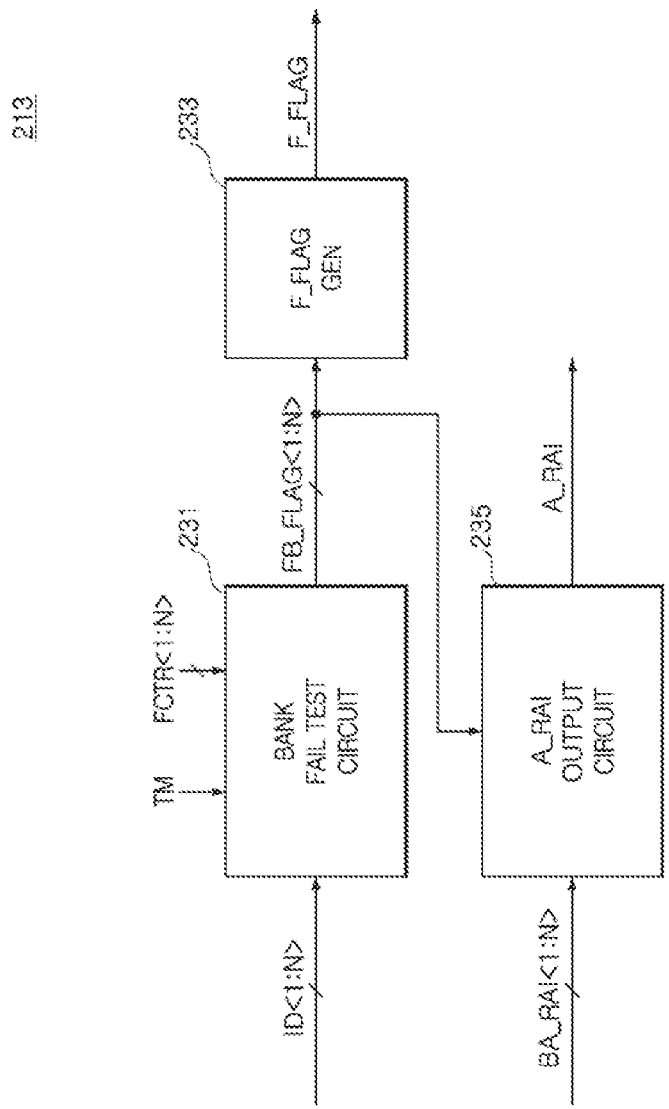
FIG. 4 is a block diagram illustrating an example configuration of a fail test circuit illustrated in FIG. 2.

FIG. 4 is a block diagram illustrating an example configuration of the fail test circuit 213 illustrated in FIG. 2. As illustrated in FIG. 4, the fail test circuit 213 may include a bank fail test circuit 231, a fail flag generation circuit (F_FLAG GEN) 233, and an active row region information output circuit (A_RAI OUTPUT CIRCUIT) 235.

When performing a test of detecting whether a failure occurred in a column line on the basis of the test mode signal TM, the bank fail test circuit 231 may generate first to $N^{th}$ fail bank flags FB_FLAG<1:N> on the basis of the first to $N^{th}$ internal data ID<1:N> and the first to $N^{th}$ fail control signals FCTR<1:N>. The first to $N^{th}$ internal data ID<1:N> may be outputted from the column lines of the first to $N^{th}$ memory banks (205<1:N> of FIG. 2), respectively. The first to $N^{th}$ fail bank flags FB_FLAG<1:N> may indicate whether failures were detected in column lines selected from the first to $N^{th}$ memory banks 205<1:N>, respectively, according to the column address (CADD of FIG. 2). When failures were detected in the column lines selected from the first to $N^{th}$ memory banks 205<1:N>, respectively, according to the column address CADD, the first to $N^{th}$ fail bank flags FB_FLAG<1:N> may have the first logic level. When no failure is detected in the column lines selected from the first to $N^{th}$ memory banks 205<1:N> according to the column address CADD, the first to $N^{th}$ fail bank flags FB_FLAG<1:N> may have the second logic level. The first to $N^{th}$ fail control signals FCTR<1:N> may be respectively activated to control the first to $N^{th}$ fail bank flags FB_FLAG<1:N> to each indicate that a failure was detected in a column line selected according to the column address CADD. That is, the first to $N^{th}$ fail control signals FCTR<1:N> may be respectively activated to set the first to $N^{th}$ fail bank flags FB_FLAG<1:N> to have the first logic level.

When performing a test of detecting whether a failure occurred in a column line, the bank fail test circuit 231 may detect whether the pattern of the first to $N^{th}$ internal data ID<1:N> is a preset pattern, and generate the first to $N^{th}$ fail bank flags FB_FLAG<1:N>. For example, when the pattern of the first internal data ID<1> is different from the preset pattern while the test is performed, the bank fail test circuit 231 may generate the first fail bank flag FB_FLAG<1> having the first logic level. On the contrary, when the pattern of the first internal data ID<1> is equal to the preset pattern while the test is performed, the bank fail test circuit 231 may generate the first fail bank flag FB_FLAG<1> having the second logic level. For another example, when the pattern of the second internal data ID<2> is different from the preset pattern while the test is performed, the bank fail test circuit 231 may generate the second fail bank flag FB_FLAG<2> having the first logic level. On the contrary, when the pattern of the second internal data ID<2> is equal to the preset pattern while the test is performed, the bank fail test circuit 231 may generate the second fail bank flag FB_FLAG<2> having the second logic level.

When performing a test, the bank fail test circuit 231 may control the first to $N^{th}$ fail bank flags FB_FLAG<1:N> to indicate that failures were detected in column lines selected from the first to $N^{th}$ memory banks (205<1:N> of FIG. 2) according to the column address (CADD of FIG. 2), on the basis of the first to $N^{th}$ fail control signals FCTR<1:N>, respectively. For example, when the first fail control signal FCTR<1> is activated while the test is performed, the bank fail test circuit 231 may set the first fail bank flag FB_FLAG<1> to the first logic level. For another example, when the second fail control signal FCTR<2> is activated while the test is performed, the bank fail test circuit 231 may set the second fail bank flag FB_FLAG<2> to the first logic level.

The fail flag generation circuit 233 may generate the fail flag F_FLAG on the basis of the first to $N^{th}$ fail bank flags FB_FLAG<1:N>. When at least one of the first to $N^{th}$ fail bank flags FB_FLAG<1:N> is set to the first logic level, the fail flag generation circuit 233 may generate the fail flag F_FLAG indicating that a failure was detected in a column line. When the first to N fail bank flags FB_FLAG<1:N> are all set to the second logic level, the fail flag generation circuit 233 may generate the fail flag F_FLAG indicating that no failure is detected in a column line.

The active row region information output circuit 235 may select one of the first to $N^{th}$ bank active row region information BA_RAI<1:N> on the basis of the first to $N^{th}$ fail bank flags FB_FLAG<1:N>, and output the selected information as the active row region information A_RAI. More specifically, when the first fail bank flag FB_FLAG<1> indicates that a failure was detected in a column line of the first memory bank (205<1> of FIG. 2), the active row region information output circuit 235 may output, as the active row region information A_RAI, the first bank active row region information BA_RAI<1> which is generated when the active operation is performed in the first memory bank 205<1>. When the second fail bank flag FB_FLAG<2> indicates that a failure was detected in a column line of the second memory bank (205<2> of FIG. 2), the active row region information output circuit 235 may output, as the active row region information A_RAI, the second bank active row region information BA_RAI<2> which is generated when an active operation is performed in the second memory bank 205<2>.

Figure 5:
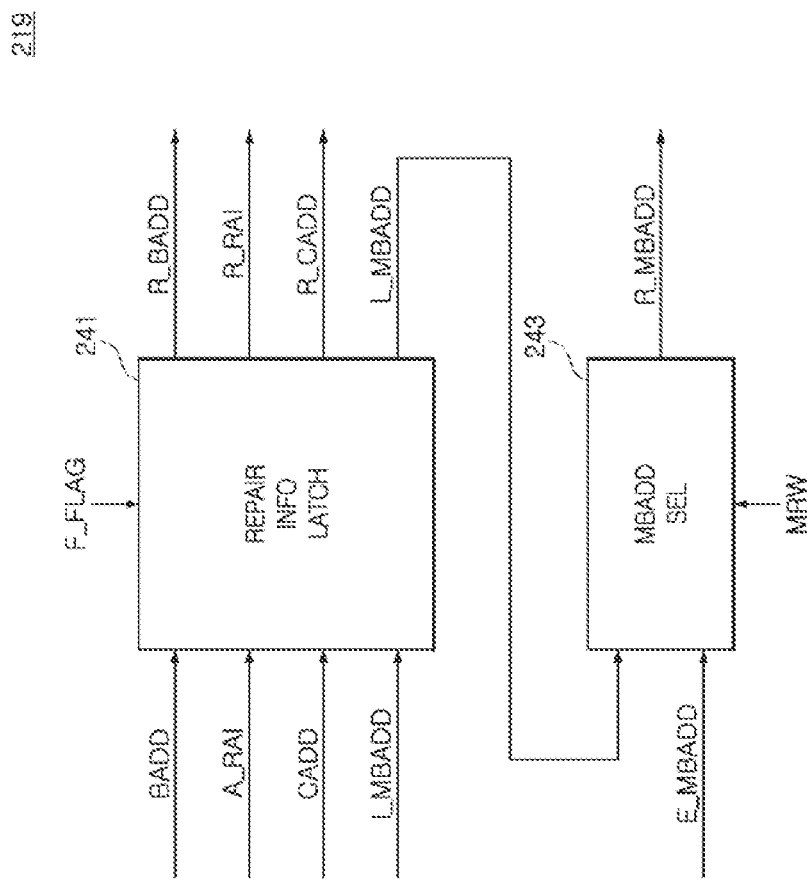
FIG. 5 is a block diagram illustrating an example configuration of a repair information generation circuit illustrated in FIG. 2.

FIG. 5 is a block diagram illustrating an example configuration of the repair information generation circuit 219 illustrated in FIG. 2. As illustrated in FIG. 5, the repair information generation circuit 219 may include a repair information latch circuit (REPAIR INFO LATCH) 241 and a block address selection circuit (MBADD SEL) 243.

The repair information latch circuit 241 may generate a repair bank address R_BADD, the repair row region information R_RAI, the repair column address R_CADD, and a latch block address L_MBADD from the bank address BADD, the active row region information A_RAI, the column address CADD, and the internal block address I_MBADD, respectively, on the basis of the fail flag F_FLAG. More specifically, when the fail flag F_FALG indicates that a failure was detected in a column line, the repair information latch circuit 241 may latch the bank address BADD, and output the latched address as the repair bank address R_BADD. When the fail flag F_FALG indicates that a failure was detected in a column line, the repair information latch circuit 241 may latch the active row region information A_RAI, and output the latched information as the repair row region information R_RAI. When the fail flag F_FALG indicates that a failure was detected in a column line, the repair information latch circuit 241 may latch the column address CADD, and output the latched address as the repair column address R_CADD. When the fail flag F_FALG indicates that a failure was detected in a column line, the repair information latch circuit 241 may latch the internal block address I_MBADD, and output the latched address as the latch block address L_MBADD.

The block address selection circuit 243 may select one of the latch block address L_MBADD and the external block address E_MBADD and output the selected address as the repair block address R_MBADD, on the basis of the mode register command MRW. More specifically, when the mode register command MRW is activated, the block address selection circuit 243 may output the external block address E_MBADD as the repair block address R_MBADD. When the mode register command MRW is inactivated, the block address selection circuit 243 may output the latch block address L_MBADD as the repair block address R_MBADD.

Figure 6:
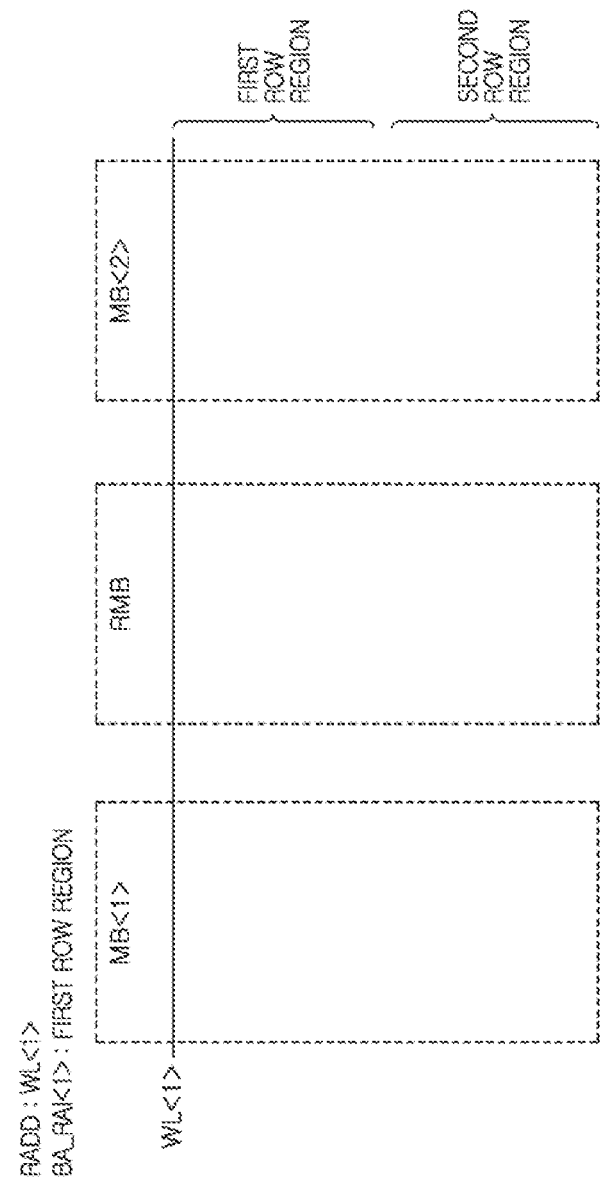
FIGS. 6 to 8 are diagrams for describing an operation in which a row control circuit illustrated in FIG. 2 generates bank active row region information.

FIG. 6 is a diagram for describing an operation in which the row control circuit 207 illustrated in FIG. 2 generates the first bank active row region information BA_RAI<1>, when the normal word line WL selected according to the row address RADD is not repaired in the case that the active operation is performed in the first memory bank 205<1>. As illustrated in FIG. 6, when the row address RADD corresponding to the first normal word line WL<1> is inputted during the active operation, the row control circuit 207 may activate the first normal word line WL<1>. Because the activated first normal word line WL<1> belongs to the first row region FIRST ROW REGION, the row control circuit 207 may generate the first bank active row region information BA_RAI<1> indicating the first row region FIRST ROW REGION.

Figure 7:
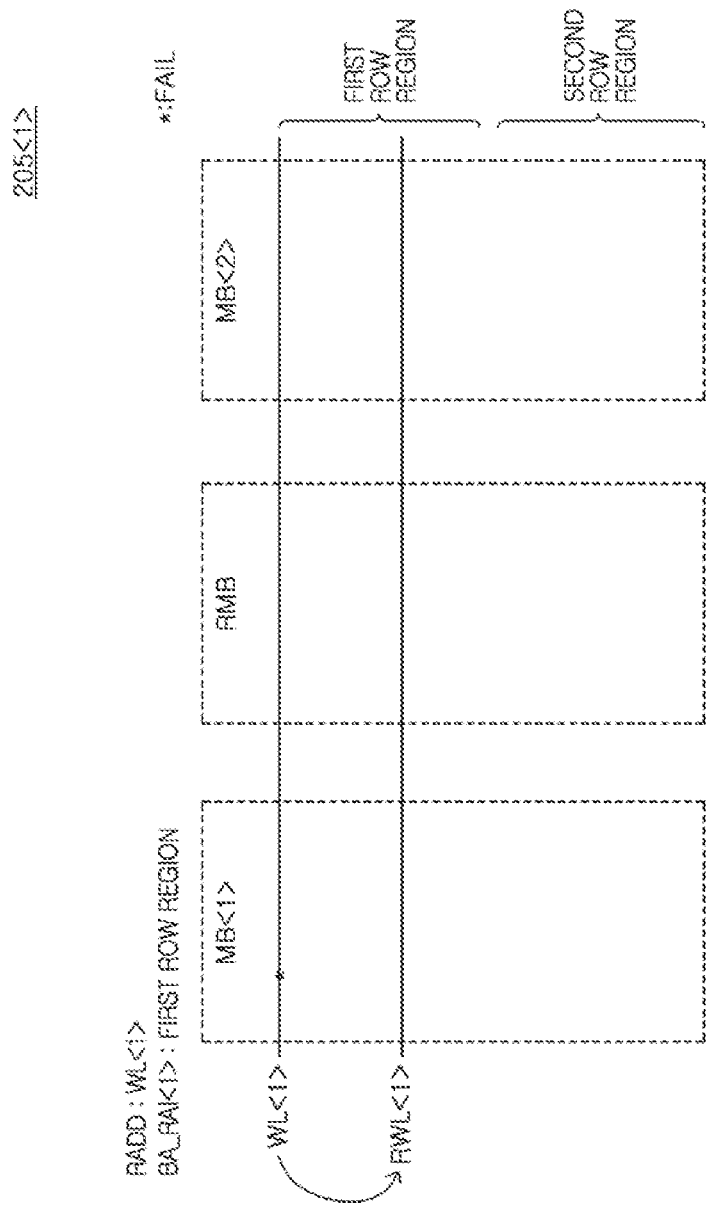

FIG. 7 is a diagram for describing an operation in which the row control circuit 207 illustrated in FIG. 2 generates the first bank active row region information BA_RAI<1>, when the normal word line WL selected according to the row address RADD is repaired with the redundancy word line RWL in the same row region in the case that the active operation is performed in the first memory bank 205<1>. FIG. 7 shows that the first normal word line WL<1> in which a failure 'FAIL' occurred has been repaired with the first redundancy word line RWL<1>. The first normal word line WL<1> and the first redundancy word line RWL<1> are both located in the first row region FIRST ROW REGION. At this time, the first row fuse data RFZD<1> corresponding to the first redundancy word line RWL<1> may have a combination corresponding to the first normal word line WL<1> in which the failure occurred. When the row address RADD corresponding to the first normal word line WL<1> is inputted during the active operation, the row control circuit 207 may activate the first redundancy word line RWL<1> on the basis of the first row fuse data RFZD<1>. Because the activated first redundancy word line RWL<1> belongs to the first row region FIRST ROW REGION, the row control circuit 207 may generate the first bank active row region information BA_RAI<1> indicating the first row region FIRST ROW REGION.

Figure 8:
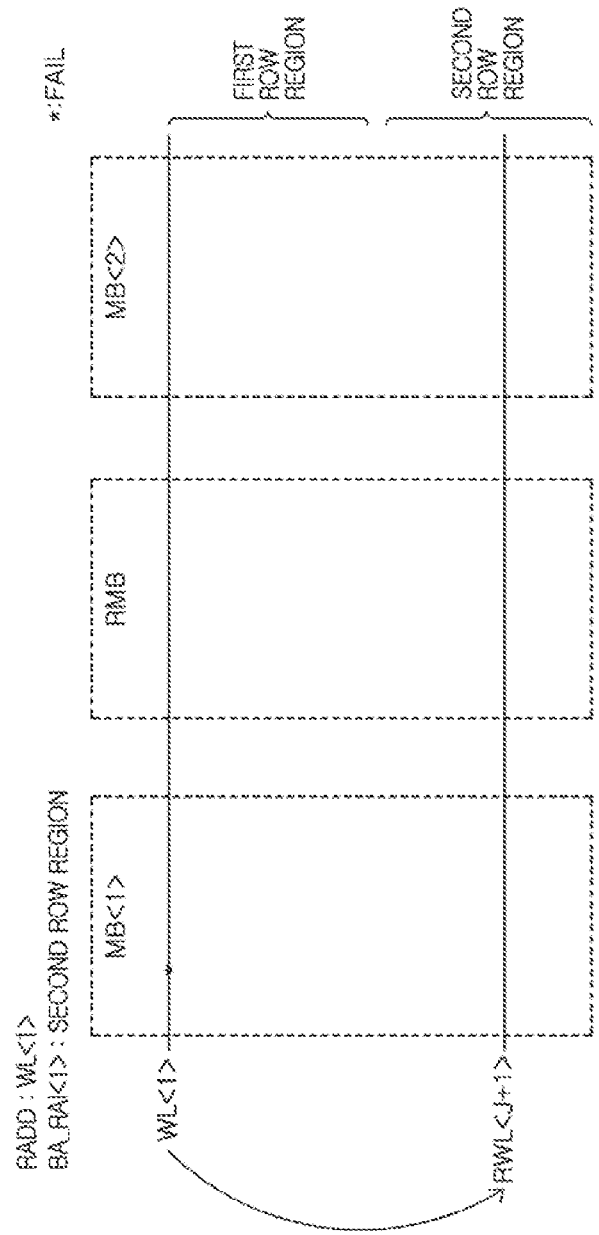

FIG. 8 is a diagram for describing an operation in which the row control circuit 207 illustrated in FIG. 2 generates the first bank active row region information BA_RAI<1>, when the normal word line WL selected according to the row address RADD is repaired with the redundancy word line RWL in a different row region in the case that the active operation is performed in the first memory bank 205<1>. FIG. 8 shows that the first normal word line WL<1> in which a failure 'FAIL' occurred has been repaired with the (J+1)$^{th}$ redundancy word line RWL<J+1>. The first normal word line WL<1> and the (J+1)$^{th}$ redundancy word line RWL<J+1> are located in the first row region FIRST ROW REGION and the second row region SECOND ROW REGION, respectively. At this time, the (J+1)$^{th}$ row fuse data RFZD<J+1> corresponding to the (J+1)$^{th}$ redundancy word line RWL<J+1> may have a combination corresponding to the first normal word line WL<1> in which the failure occurred. When the row address RADD corresponding to the first normal word line WL<1> is inputted during the active operation, the row control circuit 207 may activate the (J+1) redundancy word line RWL<J+1> on the basis of the (J+1)$^{th}$ row fuse data RFZD<J+1>. Because the activated (J+1)$^{th}$ redundancy word line RWL<J+1> belongs to the second row region SECOND ROW REGION, the row control circuit 207 may generate the first bank active row region information BA_RAI<1> indicating the second row region SECOND ROW REGION.

Figure 9:
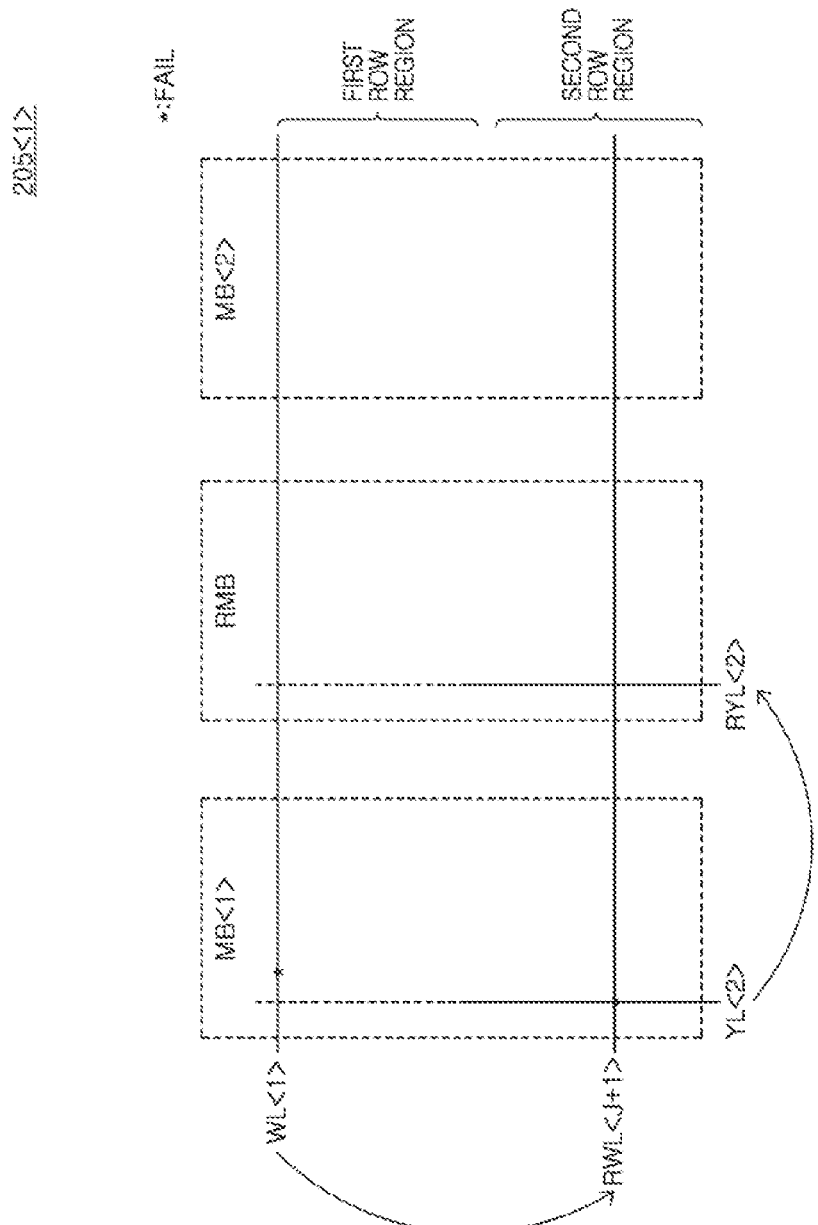
FIG. 9 is a diagram for describing an operation in which the memory device illustrated in FIG. 2 repairs a column line, in which a failure occurred, for each row region.

FIG. 9 is a diagram for describing an operation in which the memory device 120 illustrated in FIG. 2 repairs a column line where a failure occurred in the first memory bank 205<1>, for each row region. FIG. 9 shows that the first normal word line WL<1> in which a failure 'FAIL' occurred has been repaired with the (J+1)$^{th}$ redundancy word line RWL<J+1>, and the second normal column line YL<2> in which a failure 'FAIL' occurred has been repaired with the second redundancy column line RYL<2> in the second row region SECOND ROW REGION. Thus, when the first bank active row region information BA_RAI<1> indicates the second row region SECOND ROW REGION in the case that the column address CADD corresponding to the second normal column line YL<2> is inputted, the column control circuit 209 may select the second redundancy column line RYL<2>. On the contrary, when the first bank active row region information BA_RAI<1> indicates the first row region FIRST ROW REGION in the case that the column address CADD corresponding to the second normal column line YL<2> is inputted, the column control circuit 209 may select the second normal column line YL<2>.

Figure 10:
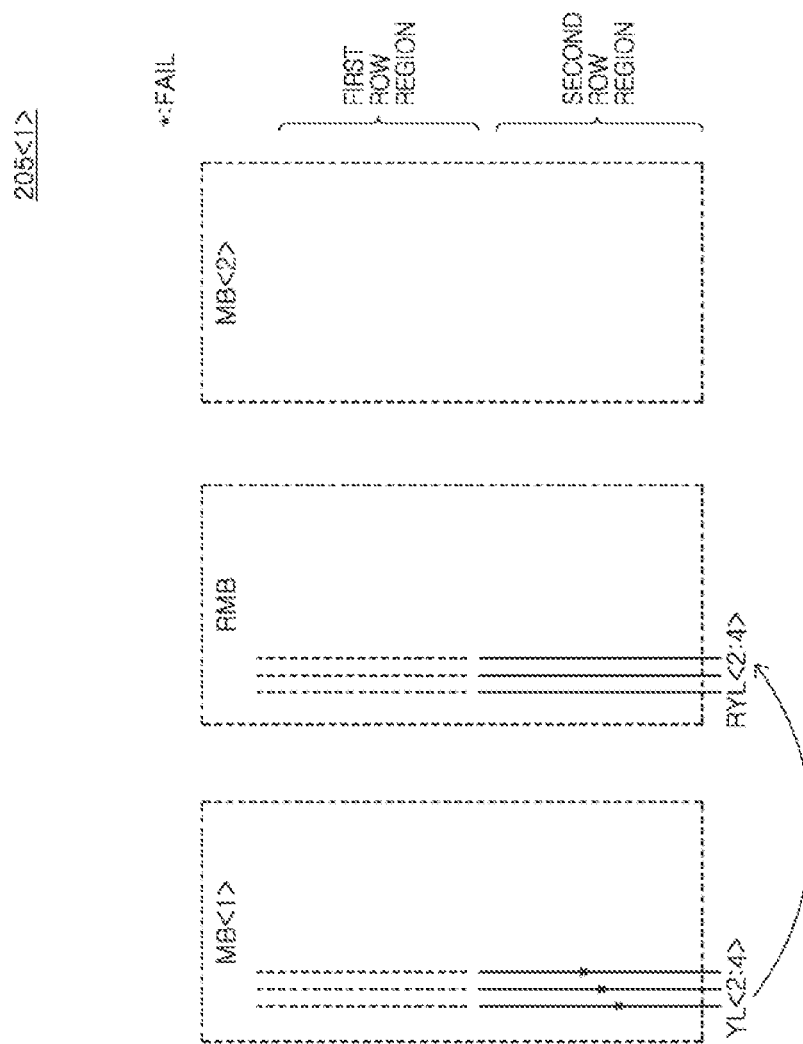
FIG. 10 is a diagram for describing an operation in which the memory device illustrated in FIG. 2 repairs column lines in which failures intensively occurred.

FIG. 10 is a diagram for describing an operation in which the memory device 120 illustrated in FIG. 2 repairs column lines where failures intensively occurred in the first memory bank 205<1>. FIG. 10 shows that the second to fourth normal column lines YL<2:4> where failures 'FAIL' intensively occurred in the first memory block MB<1> have been repaired with the second to fourth redundancy column lines RYL<2:4>, respectively. Although no failures occurred in the first and fifth normal column lines (not illustrated), failures are likely to occur in the first and fifth normal column lines because the first and fifth normal column lines are adjacent to the second to fourth normal column lines YL<2:4> where failures 'FAIL' intensively occurred in the first memory block MB<1>.

Figure 11:
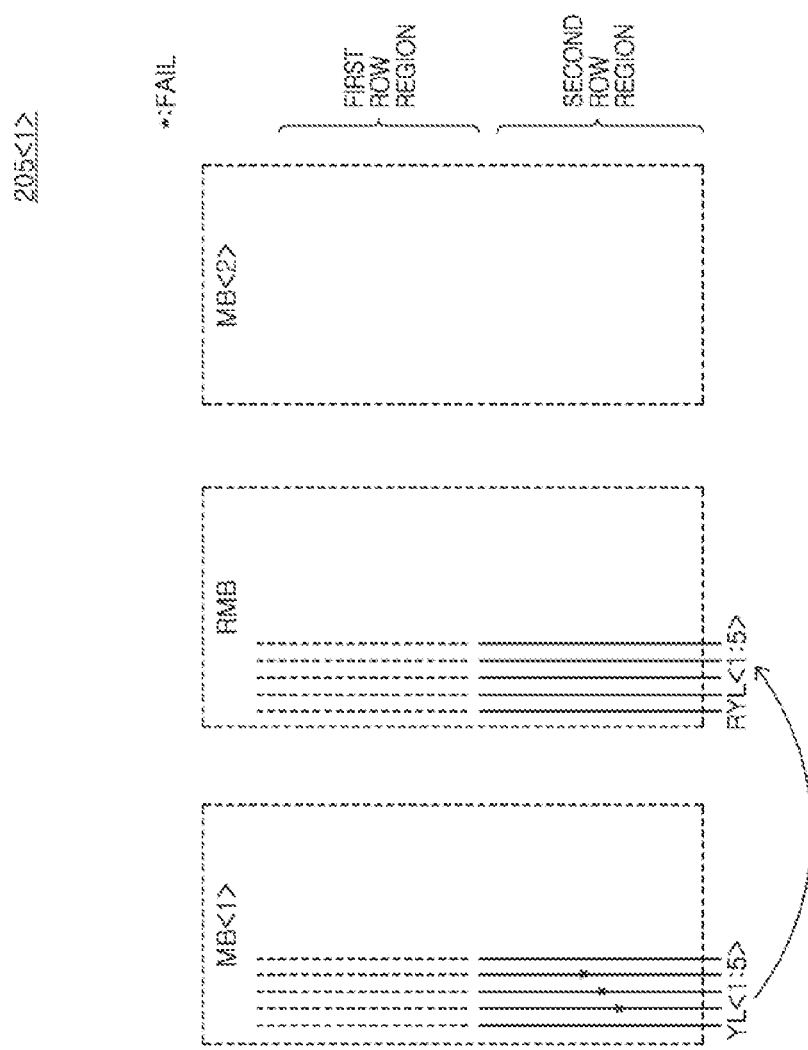
FIG. 11 is a diagram for describing an operation in which the memory device illustrated in FIG. 2 repairs a column line in which a failure is likely to occur.

FIG. 11 is a diagram for describing an operation in which the memory device 120 illustrated in FIG. 2 repairs a column line where a failure is likely to occur in the first memory bank 205<1>. FIG. 11 shows that the second to fourth normal column lines YL<2:4> where failures 'FAIL' intensively occurred in the first memory block MB<1> have been repaired with the second to fourth redundancy column lines RYL<2:4>, respectively. When performing a test of detecting whether a failure occurred in a column line, the memory device 120 may process, as column lines in which failures were detected, the first and fifth normal column lines YL<1, 5> in which failures are likely to occur, on the basis of the fail control signal (FCTR of FIG. 2), thereby repairing the first and fifth normal column lines YL<1, 5> with the first and fifth redundancy column lines RYL<1, 5>.

Figure 12:
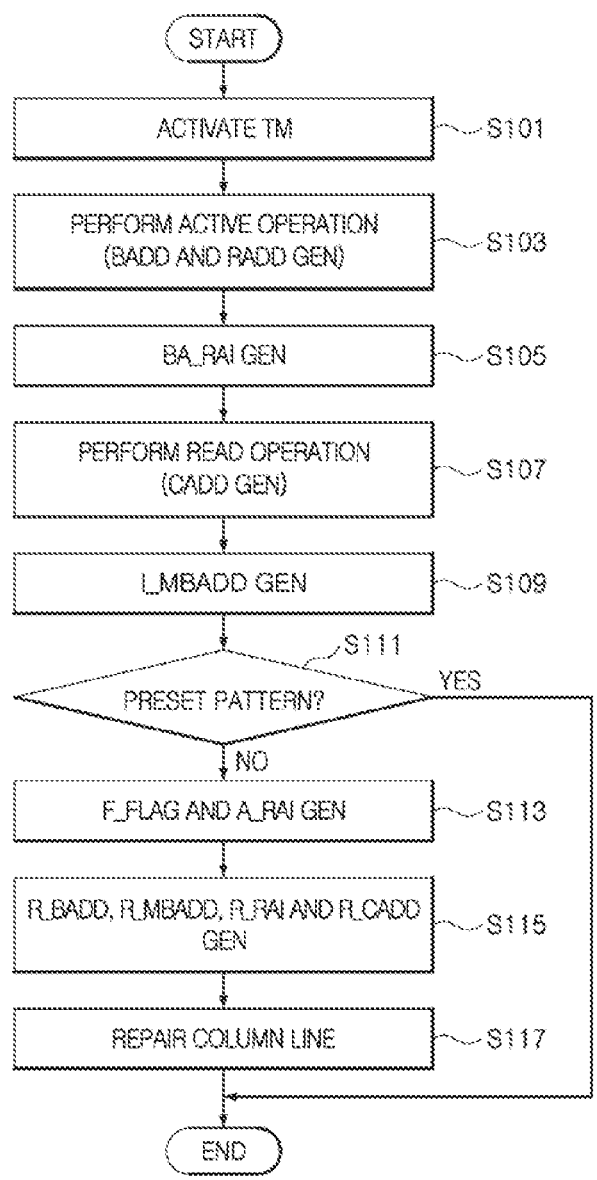
FIG. 12 is a flowchart for describing an operation in which the memory device illustrated in FIG. 2 repairs a column line in which a failure occurred.

FIG. 12 is a flowchart for describing an operation in which the memory device 120 illustrated in FIG. 2 repairs a column line in which a failure occurred.

The fail test circuit 213 may perform a test of detecting whether a failure occurred in a column line, on the basis of the activated test mode signal TM, in step S101.

The command decoder 201 generates the active command ACT by decoding the command address CA having a logic level combination for performing an active operation. When the active operation is performed, the address decoder 203 generates the bank address BADD and the row address RADD by decoding the command address CA, in step S103.

When performing the active operation, the row control circuit 207 generates the bank active row region information BA_RAI indicating a row region to which a word line activated in the memory bank 205 selected according to the bank address BADD belongs, on the basis of the row address RADD and the row fuse data RFZD, in step S105.

The command decoder 201 generates the read command RD by decoding the command address CA having a logic level combination for performing a read operation. When the read operation is performed, the address decoder 203 generates the column address CADD corresponding to the column line whose failure is to be detected, by decoding the command address CA. When the read operation is performed, the column control circuit 209 outputs the internal data ID from the column line selected according to the column address CADD, in step S107.

The internal block address generation circuit 215 generates the internal block address I_MBADD indicating the position of a memory block to which a column line in which a failure occurred belongs, on the basis of the internal data ID outputted from the column line of the memory block included in the memory bank 205, in step S109.

When performing a test of detecting whether a failure occurred in a column line, the fail test circuit 213 may detect whether the pattern of the internal data ID outputted from the column line is a preset pattern, in step S111.

When the detection result of step S111 indicates that the pattern of the internal data ID outputted from the column line is equal to the preset pattern, the operation of repairing the column line in which the failure occurred is ended.

When the detection result of step S111 indicates that the pattern of the internal data ID outputted from the column line is different from the preset pattern, the fail test circuit 213 generates the fail flag F_FLAG indicating that the failure was detected in the column line, and outputs the bank active row region information BA_RAI as the active row region information A_RAI, in step S113.

When the fail flag F_FLAG indicates that the failure was detected in the column line, the repair information generation circuit 219 generates the repair bank address R_BADD, the repair block address R_MBADD, the repair row region information R_RAI, and the repair column address R_CADD from the bank address BADD, the internal block address I_MBADD, the active row region information A_RAI, and the column address CADD, respectively, in step S115.

The repair circuit 221 repairs the column line in which the failure was detected, on the basis of the repair bank address R_BADD, the repair block address R_MBADD, the repair row region information R_RAI, and the repair column address R_CADD, in step S117.

Figure 13:
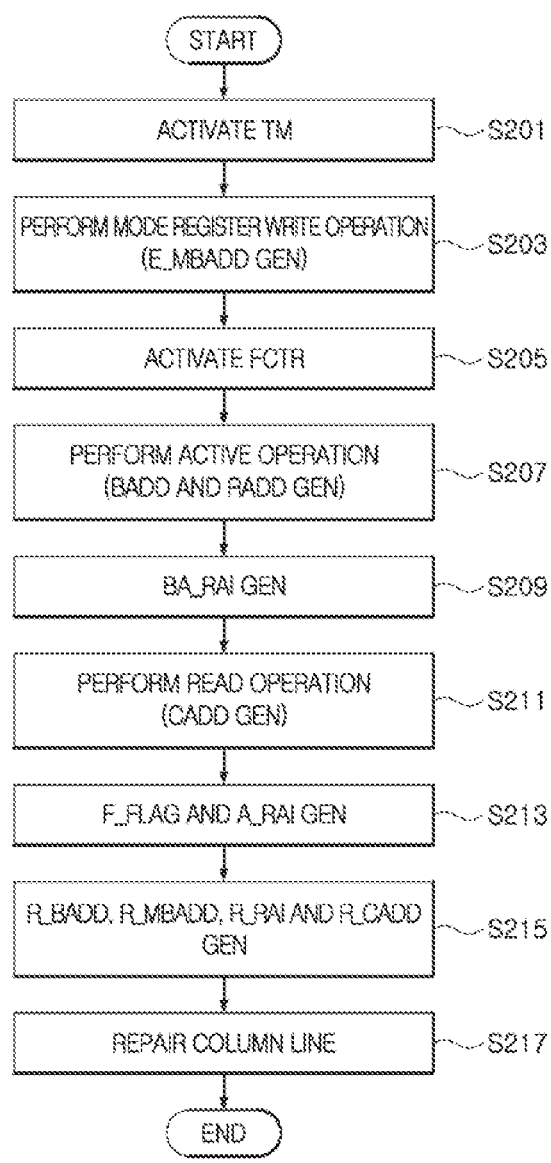
FIG. 13 is a flowchart for describing an operation in which the memory device illustrated in FIG. 2 repairs a column line in which a failure is likely to occur.

FIG. 13 is a flowchart for describing an operation in which the memory device 120 illustrated in FIG. 2 repairs a column line in which a failure is likely to occur.

The fail test circuit 213 may perform a test of detecting whether a failure occurred in a column line, on the basis of the activated test mode signal TM, in step S201.

The command decoder 201 generates the mode register command MRW by decoding the command address CA having a logic level combination for performing a mode register write operation. The external block address generation circuit 217 extracts the command address CA on the basis of the mode register command MRW, and generates the external block address E_MBADD indicating the position of a memory block to which a column line in which a failure is likely to occur belongs, in step S203.

The fail test circuit 213 controls the fail flag F_FLAG to indicate that a failure was detected in the column line, on the basis of the activated fail control signal FCTR, in step S205.

The command decoder 201 generates the active command ACT by decoding the command address CA having a logic level combination for performing an active operation. When the active operation is performed, the address decoder 203 generates the bank address BADD and the row address RADD by decoding the command address CA, in step S207.

When performing the active operation, the row control circuit 207 generates the bank active row region information BA_RAI indicating a row region to which a word line activated in the memory bank 205 selected according to the bank address BADD belongs, on the basis of the row address RADD and the row fuse data RFZD, in step S209.

The command decoder 201 generates the read command RD by decoding the command address CA having a logic level combination for performing a read operation. When the read operation is performed, the address decoder 203 generates the column address CADD corresponding to a column line in which a failure is likely to occur, by decoding the command address CA, in step S211.

The fail test circuit 213 generates the fail flag F_FLAG indicating that the failure was detected in the column line, on the basis of the activated fail control signal FCTR and outputs the bank active row region information BA_RAI as the active row region information A_RAI, in step S213.

When the fail flag F_FLAG indicates that the failure was detected in the column line, the repair information generation circuit 219 generates the repair bank address R_BADD, the repair block address R_MBADD, the repair row region information R_RAI, and the repair column address R_CADD from the bank address BADD, the external block address E_MBADD, the active row region information A_RAI, and the column address CADD, respectively, in step S215.

The repair circuit 221 repairs the column line in which the failure was detected, on the basis of the repair bank address R_BADD, the repair block address R_MBADD, the repair row region information R_RAI, and the repair column address R_CADD, in step S217.

Although some embodiments of the present teachings have been described for illustrative purposes, those skilled in the art will appreciate that various modifications, additions, and substitutions are possible, without departing from the scope and spirit of the present teachings as defined in the accompanying claims.

What is claimed is:
1. A memory device comprising:
 a fail test circuit configured to generate a fail flag indicating whether a failure was detected in a column line, on the basis of internal data outputted from the column line selected according to a column address, when performing a test, and control the fail flag to indicate that the failure was detected in the column line, on the basis of a fail control signal;

a repair information generation circuit configured to generate, from the column address, a repair column address for repairing the column line, on the basis of the fail flag, and wherein the fall test circuit configured to generate the fall flag when the test is performed basis of a test mode signal generated from a command address.

2. The memory device of claim 1, wherein the fail test circuit is configured to generate the fail flag indicating that the failure was detected in the column line, when a pattern of the internal data is different from a preset pattern during the test or the fail control signal is activated.

3. The memory device of claim 2, wherein the repair information generation circuit is configured to latch the column address and output the latched address as the repair column address, when the fail flag indicates that the failure was detected in the column line.

4. The memory device of claim 1, wherein the repair information generation circuit is configured to generate a repair block address for repairing the column line, by selecting one of an external block address and an internal block address indicating the position of a memory block, on the basis of the fail flag and a mode register command, wherein the memory block comprises column lines corresponding to the column address.

5. The memory device of claim 4, further comprising:

an internal block address generation circuit configured to generate the internal block address indicating the position of the memory block to which a column line in which a failure occurred belongs, on the basis of the internal data outputted from the column line; and an external block address generation circuit configured to extract the external block address from the command address on the basis of the mode register command.

6. The memory device of claim 4, wherein the repair information generation circuit comprises:

a repair information latch circuit configured to latch the internal block address and output the latched address as a latch block address, when the fail flag indicates that the failure was detected in the column line; and a block address selection circuit configured to output the internal block address as the repair block address when the mode register command is inactivated, and output the external block address as the repair block address when the mode register command is activated.

7. The memory device of claim 1, wherein the fail control signal comprises a first fail control signal and a second fail control signal, wherein the fail test circuit is configured to output first bank active row region information corresponding to a first memory bank as active row region information on the basis of the first fail control signal, and output second bank active row region information corresponding to a second memory bank as the active row region information on the basis of the second fail control signal, when performing the test, wherein the repair information generation circuit is configured to generate, from the active row region information, repair row region information for repairing the column line, on the basis of the fail flag.

8. The memory device of claim 7, wherein the fail test circuit is configured to control the fail flag to indicate that a failure was detected in the column line, when at least one of the first and second fail control signals is activated.

9. The memory device of claim 8, wherein the repair information generation circuit is configured to, when the fail flag indicates that a failure was detected in the column line:

latch the active row region information and output the latched information as the repair row region information; and latch a bank address corresponding to one of the first and second memory banks and output the latched address as a repair bank address for repairing the column line.

10. The memory device of claim 7, further comprising a row control circuit configured to activate a word line on the basis of a bank address, a row address, and row fuse data, and generate the first bank active row region information and the second bank active row region information, when performing an active operation, wherein the first bank active row region information indicates the position of a row region to which the activated word line belongs, when the active operation is performed in the first memory bank, and wherein the second bank active row region information indicates the position of the row region to which the activated word line belongs, when the active operation is performed in the second memory bank.

11. The memory device of claim 7, wherein the fail test circuit is configured to output, when the first fail control signal is activated or the pattern of the internal data outputted from the first memory bank is different from a preset pattern during the test, the first bank active row region information as the active row region information.

12. The memory device of claim 11, wherein the fail test circuit is configured to output, when the second fail control signal is activated or the pattern of the internal data outputted from the second memory bank is different from a preset pattern during the test, the second bank active row region information as the active row region information.

13. A memory device comprising:

a bank fail test circuit configured to generate a first fail bank flag indicating whether a failure was detected in a first memory bank, on the basis of first internal data outputted from a column line of the first memory bank, and control the first fail bank flag to indicate that a failure was detected in the first memory bank, on the basis of a first fail control signal, when performing a test;

an active row region information output circuit configured to output first bank active row region information as active row region information for repairing the column line, on the basis of the first fail bank flag, the first bank active row region information being generated when an active operation is performed in the first memory bank, and wherein the bank fall test circuit configured to generate the first fall bank flag when the test is performed basis of a test mode signal generated from a command address.

14. The memory device of claim 13, wherein the bank fail test circuit is configured to generate, when the pattern of the first internal data is different from a preset pattern or the first fail control signal is activated during the test, the first fail bank flag indicating that a failure was detected in the first memory bank.

15. The memory device of claim 14, wherein the active row region information output circuit is configured to output, when the first fail bank flag indicates that a failure was detected in the first memory bank, the first bank active row region information as the active row region information.

16. The memory device of claim 13, wherein the bank fail test circuit is configured to generate, when performing a test, a second fail bank flag indicating whether a failure was detected in a second memory bank, on the basis of second internal data outputted from a column line of the second memory bank, and control the second fail bank flag to indicate that a failure was detected in the second memory bank, on the basis of a second fail control signal, wherein the active row region information output circuit is configured to output second bank active row region information as the active row region information on the basis of the second fail bank flag, the second bank active row region information being generated when the active operation is performed in the second memory bank.

17. The memory device of claim 16, further comprising a row control circuit configured to activate a word line on the basis of a bank address, a row address, and row fuse data, and generate the first bank active row region information and the second bank active row region information, when performing the active operation, wherein the first bank active row region information indicates the position of a row region to which the activated word line belongs, when the active operation is performed in the first memory bank, and wherein the second bank active row region information indicates the position of the row region to which the activated word line belongs, when the active operation is performed in the second memory bank.

* * * * *